US012396135B2

(12) United States Patent
Sanada

(10) Patent No.: US 12,396,135 B2
(45) Date of Patent: Aug. 19, 2025

(54) COOLING DEVICE FOR ELECTRONIC EQUIPMENT

(71) Applicant: TOSHIBA TEC KABUSHIKI KAISHA, Tokyo (JP)

(72) Inventor: Tsuyoshi Sanada, Susono Shizuoka (JP)

(73) Assignee: TOSHIBA TEC KABUSHIKI KAISHA, Tokyo (JP)

( * ) Notice: Subject to any disclaimer, the term of this patent is extended or adjusted under 35 U.S.C. 154(b) by 225 days.

(21) Appl. No.: 18/361,956

(22) Filed: Jul. 31, 2023

(65) Prior Publication Data

US 2024/0155813 A1   May 9, 2024

(30) Foreign Application Priority Data

Nov. 8, 2022 (JP) ................. 2022-178571

(51) Int. Cl.
*H05K 7/20* (2006.01)

(52) U.S. Cl.
CPC ..... *H05K 7/20409* (2013.01); *H05K 7/20172* (2013.01)

(58) Field of Classification Search
CPC ... H01L 23/3672; H01L 23/4093; G06F 1/20; G06F 1/206; G06F 2200/201; G06F 1/203; H05K 7/20154; H05K 7/20145; H05K 7/2039; H05K 7/20172; H05K 7/20409; H05K 7/20727; H05K 7/20745; F24F 1/0029; F24F 1/0059; F24F 13/082; F24F 13/20; F24F 2013/0616; B60H 1/00042; B60H 1/00; B01D 2267/70; B01D 2273/14; B01D 2279/50; B01D 46/0006; B01D 46/12; B01D 46/18; F28D 2021/0029; F28D 5/00

See application file for complete search history.

(56) References Cited

U.S. PATENT DOCUMENTS

| 6,478,082 B1 * | 11/2002 | Li ............... F28F 13/003 257/E23.102 |
| 7,040,384 B2 * | 5/2006 | Shiang-Chich ..... H01L 23/4093 165/104.34 |
| 7,414,842 B2 * | 8/2008 | Hao ................. H01L 23/467 257/E23.099 |
| 7,492,590 B2 * | 2/2009 | Chen ............... H05K 7/20172 174/16.3 |

(Continued)

FOREIGN PATENT DOCUMENTS

JP   2003-283171   10/2003

*Primary Examiner* — Michael A Matey
(74) *Attorney, Agent, or Firm* — Amin, Turocy & Watson, LLP

(57) ABSTRACT

A fan duct (cooling device) includes: a plurality of ribs that have two different types of forms alternately arranged, the ribs each being disposed from the branch wall toward the fins in a manner of being parallel to the fins and including an apex portion at a tip end thereof being inserted between adjacent ones among the fins, a base of the rib being connected to the branch wall, the rib being configured to branch, at the tip end, the flow of air passing between the fins into two directions; and an exhaust port configured to exhaust the air branched by the rib and the branch wall. Among the ribs inserted between the adjacent ribs, at least ribs of one form are in contact with the fins.

20 Claims, 7 Drawing Sheets

(56) References Cited

U.S. PATENT DOCUMENTS

| | | | |
|---|---|---|---|
| 7,515,414 B2* | 4/2009 | Horng | H01L 23/467 361/695 |
| 2005/0041392 A1* | 2/2005 | Chen | H05K 7/20727 361/695 |
| 2007/0035926 A1* | 2/2007 | Xia | H01L 23/467 257/E23.099 |
| 2007/0041159 A1* | 2/2007 | Bate | G11B 33/142 |
| 2007/0091566 A1* | 4/2007 | Sun | G06F 1/20 361/695 |
| 2007/0097630 A1* | 5/2007 | Lee | H01L 23/427 257/E23.099 |
| 2007/0144727 A1* | 6/2007 | Hirayama | B60H 1/0005 165/203 |
| 2007/0165374 A1* | 7/2007 | Chen | H01L 23/467 257/E23.099 |
| 2007/0256433 A1* | 11/2007 | Bhatti | F24F 1/035 62/304 |
| 2008/0062641 A1* | 3/2008 | Lai | H01L 23/467 257/E23.099 |
| 2009/0129018 A1* | 5/2009 | Zhou | H01L 23/467 361/697 |
| 2012/0181003 A1* | 7/2012 | Zurowski | H05K 7/20154 165/121 |
| 2014/0251322 A1* | 9/2014 | Miller | A61M 16/0891 128/201.13 |
| 2020/0148025 A1* | 5/2020 | Tashima | B60H 1/3407 |
| 2024/0075754 A1* | 3/2024 | Mima | B41J 29/377 |
| 2024/0410598 A1* | 12/2024 | Sekito | F24F 13/24 |

* cited by examiner

COOLING DEVICE FOR ELECTRONIC EQUIPMENT

CROSS-REFERENCE TO RELATED APPLICATION

This application is based upon and claims the benefit of priority from Japanese Patent Application No. 2022-178571, filed on Nov. 8, 2022, the entire contents of which are incorporated herein by reference.

FIELD

Embodiments described herein relate generally to a cooling device for electronic equipment.

BACKGROUND

In the related art, electronic equipment such as a personal computer (PC) includes a component whose temperature increases to a high temperature, such as a central processing unit (CPU). A heat sink is generally attached to such a component for heat dissipation. The air suctioned by a fan disposed upstream flows to the heat sink and is exhausted downstream of the heat sink, whereby heat is dissipated.

Recently, to meet requirements for miniaturization of electronic equipment, components such as input and output equipment of a CPU and a connector may be disposed downstream of a heat sink in a housing of electronic equipment. Such a component is not preferable because a smooth flow of a gas passing through the heat sink is hindered and the heat dissipation performance is deteriorated.

DETAILED DESCRIPTION

In general, according to one embodiment, a cooling device for electronic equipment that can obtain good heat dissipation performance even when an obstacle is present on a leeward side of a heat sink is provided.

A cooling device for electronic equipment according to one embodiment includes an intake port, a heat sink, a branch wall, a plurality of ribs, and an exhaust port. The intake port is provided with a fan and introduces air. The heat sink dissipates heat generated from electronic equipment by allowing air introduced from the intake port to pass between a plurality of fins. The branch wall is disposed downstream of a flow of air across the plurality of fins of the heat sink in a manner of being orthogonal to a longitudinal direction of the fins, and branches the flow of air passing between the fins into two directions. The plurality of ribs are each a plate-like member including an apex portion at a tip end thereof. The rib is disposed from the branch wall toward the fins in a manner of being parallel to the fins, and branches, at the tip end, a flow of air passing between the fins into two directions. The tip end of the rib is inserted between adjacent ones among the fins. A base of the rib is connected to the branch wall. The ribs have two different types of forms in a side view, and are alternately inserted between the adjacent fins. At least ribs of one form are in contact with the fins. The exhaust port discharges air branched by the ribs and the branch wall.

First Embodiment

A first embodiment in which a cooling device of the present disclosure is applied as a fan duct 1 will be described with reference to the drawings.

Figure 1:
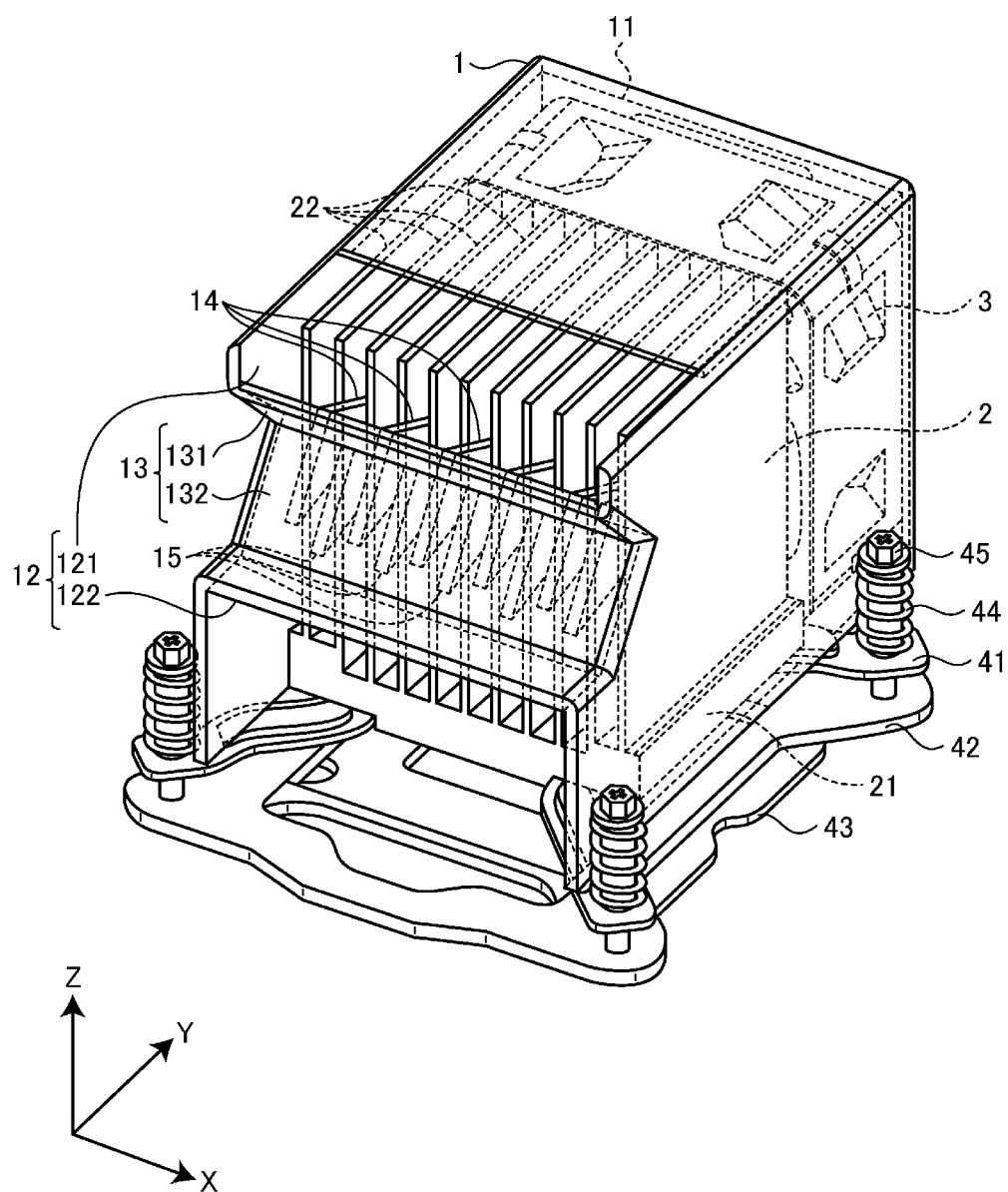
FIG. 1 is a perspective view illustrating an example of a fan duct.

Schematic Structure of Fan Duct A schematic structure of the fan duct 1 as an example of a cooling device of the present disclosure will be described with reference to FIG. 1. FIG. 1 is a perspective view illustrating the example of the fan duct according to the embodiment. For convenience of description, a three-dimensional coordinate system XYZ shown in FIG. 1 is set. In the three-dimensional coordinate system XYZ, a width direction (left-right direction) of the fan duct 1 is defined as an X-axis direction, a depth direction (front-rear direction) is defined as a Y-axis direction, and a height direction (up-down direction) is defined as a Z-axis direction.

As illustrated in FIG. 1, the fan duct 1 is a cover member that has a substantially box shape and that covers a heat sink 2 and a suction fan 3 for blowing air to the heat sink 2. The fan duct 1 is a member having so-called intake duct and exhaust duct, in which air suctioned by the suction fan 3 from an intake port 11 passes between fins 22 of the heat sink 2 installed inside a ventilation pipe (duct) and is exhausted from an exhaust port 12.

The suction fan 3 suctions air outside the fan duct 1, introduces the suctioned air into the fan duct 1, and blows the air in a −Y-axis negative direction. The suction fan 3 is an example of a fan disclosed herein. In the fan duct 1, the intake port 11 is provided at a position upstream in an air blowing direction of the suction fan 3, and the exhaust port 12 is provided at a position downstream.

Hereinafter, the simple term "upstream" means upstream (or windward) in the air blowing direction of the suction fan 3. Similarly, the simple term "downstream" means downstream (or leeward) in the air blowing direction of the suction fan 3.

The heat sink 2 is attached to an electronic component that generates heat, for example, a central processing unit (CPU). The heat generated by the CPU is conducted through the heat sink 2. The heat transferred through the heat sink 2 is dissipated to the surrounding air. Accordingly, malfunction or the like due to overheating of the CPU is prevented.

The heat sink 2 includes a base portion 21 and a plurality of fins 22. The fin 22 is erected on the base portion 21. The plurality of fins 22 are adjacent to each other at a predetermined interval. The base portion 21 is in contact with the CPU, and the heat of the CPU is conducted thereto. The fins 22 dissipate the heat conducted from the base portion 21 into the air.

The heat sink 2 is fixed on frames 41, 42, and 43, which are layered at predetermined intervals, with coiled springs 44 and screws 45. A motherboard 101 (see FIG. 2) is sandwiched between the frame 41 and the frame 42.

For example, blades rotated by an electric motor continuously blow air in one direction, whereby the suction fan 3 blows air. In the embodiment, the intake port 11, the suction fan 3, the heat sink 2, and the exhaust port 12 are arranged in this order from the upstream side to the downstream side in the air blowing direction of the suction fan 3.

In order to sufficiently exhibit the effect of the fan duct 1 described above, it is desirable that no component (obstacle) that hinders exhaust is provided on the leeward side of the exhaust port 12. However, due to a size of electronic equipment 100 (see FIG. 2) including the fan duct 1, arrangement of built-in components, and the like, an obstacle may be arranged downstream of the exhaust port 12.

In order to exhaust air while avoiding such obstacles on the leeward side, the fan duct 1 includes a branch wall 13 and a plurality of ribs 14 and 15 illustrated in FIG. 1. The branch wall 13 branches a flow of air passing between the fins 22 of the heat sink 2 into two directions. The ribs 14 and 15 are disposed on a wall surface of the branch wall 13, in parallel to the fins 22 of the heat sink 2, and branch the flow of air passing between the fins 22 of the heat sink 2 into two directions. The branch wall 13 and the ribs 14 and 15 will be described in detail later (see FIGS. 4 and 5).

Figure 2:
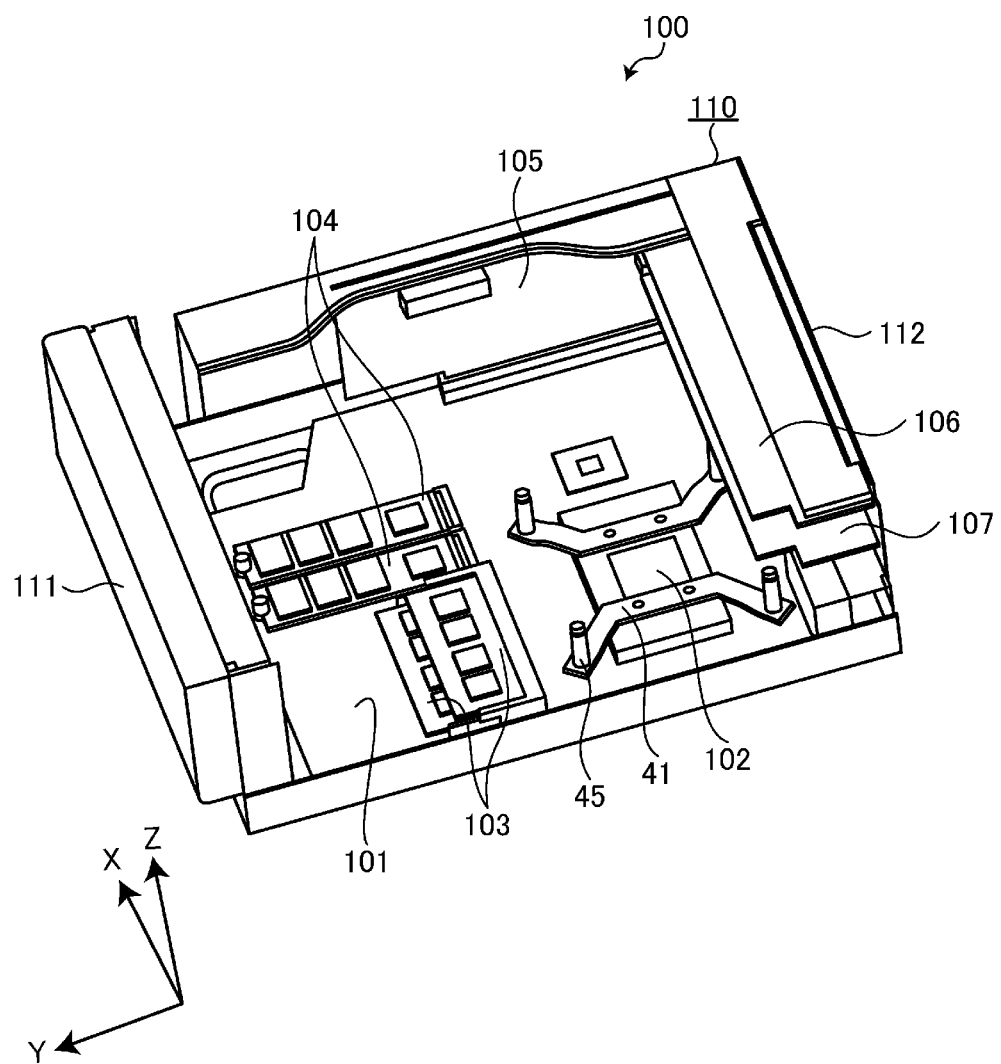
FIG. 2 is a perspective view illustrating an example of a schematic structure of electronic equipment to which the fan duct is attached.
Figure 3:
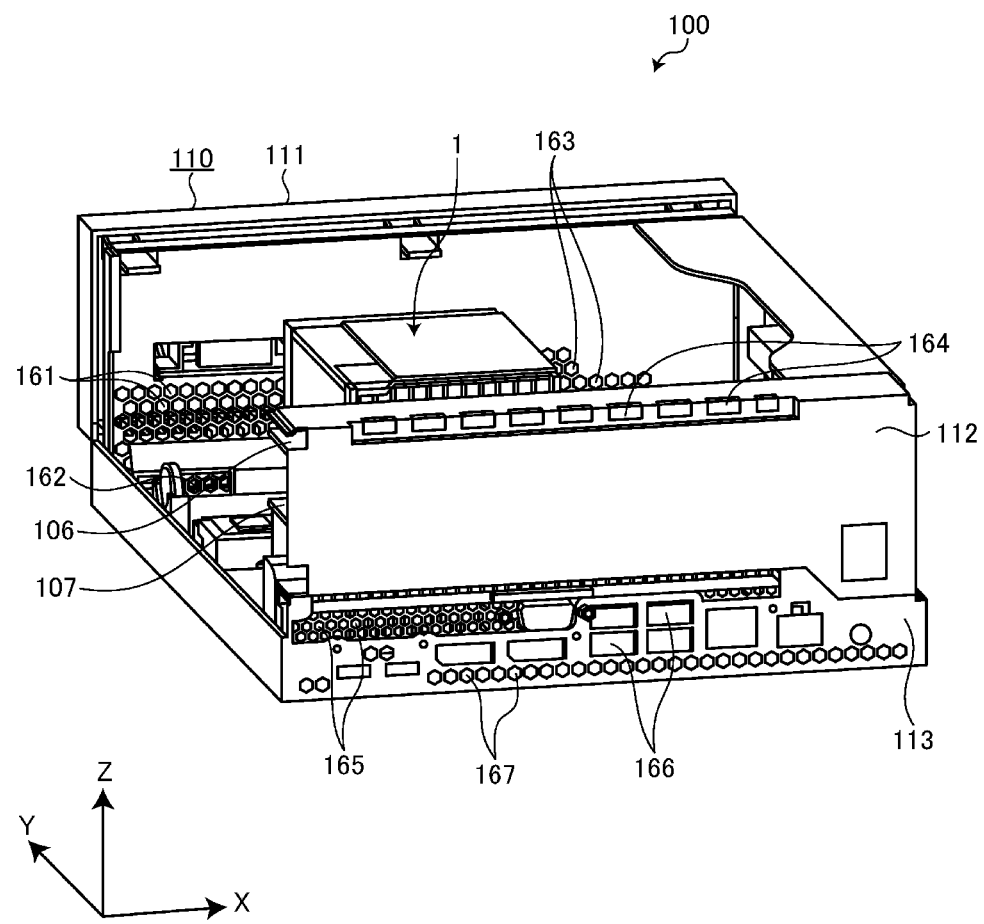
FIG. 3 is a perspective view illustrating an example of a vent hole provided in an electronic equipment.

Schematic Structure of Electronic Equipment Electronic equipment attached with a fan duct will be described with reference to FIGS. 2 and 3. FIG. 2 is a perspective view illustrating an example of a schematic structure of the electronic equipment attached with the fan duct. FIG. 3 is a perspective view illustrating an example of a vent hole provided in the electronic equipment.

As illustrated in FIG. 2, the electronic equipment 100 includes the motherboard 101, a CPU 102, a memory 103, a solid state drive (SSD) 104, a riser card 105, and input and output boards 106 and 107 inside a housing 110.

The motherboard 101 is an example of a circuit board mounted with an electronic component (the CPU 102 in the embodiment) that dissipates heat through the heat sink 2. The memory 103 and the SSD 104 also generate heat due to operations thereof. The heat is also dissipated by a flow of air in the housing 110 that is generated by the air blown by the suction fan 3.

The input and output boards 106 and 107 are connected to the motherboard 101 via an insertion port (slot) of the riser card 105. Since the input and output boards 106 and 107 are arranged in parallel to the motherboard 101 by being connected to the insertion port of the riser card 105, it is possible to reduce a height dimension of the housing 110.

However, when the input and output boards 106 and 107 are located downstream of the exhaust port 12 due to the above-described arrangement, the input and output boards 106 and 107 become obstacles that hinder the exhaust. In the embodiment, the exhaust from the fan duct 1 avoids the input and output boards 106 and 107.

As illustrated in FIG. 3, the fan duct 1 is accommodated inside the housing 110 of the electronic equipment 100. Vent holes 161, 162, and 163 for taking in air to be introduced into the fan duct 1 and vent holes 164, 165, 166, and 167 for exhausting air passing through the fan duct 1 are provided in the housing 110.

The vent holes 161, 162, and 163 are provided in a front cover 111 that constitutes a front face of the housing 110. The vent holes 164 and 165 are provided in a rear cover 112 that constitutes a rear face of the housing 110. The vent holes 166 and 167 are provided in an input and output panel 113 that constitutes a part of the rear face of the housing 110. The input and output panel 113 includes connection terminals of various types of peripheral equipment for connecting to the electronic equipment 100.

In the electronic equipment 100 of the embodiment, the input and output boards 106 and 107 are arranged behind the CPU 102. Therefore, the exhaust port 12 of the fan duct 1 is divided into an upper exhaust port 121 that opens toward upward and a lower exhaust port 122 that opens toward downward, so that the exhaust avoids the input and output boards 106 and 107 (see FIG. 1). Specifically, the exhaust port 12 is divided into the upper exhaust port 121 and the lower exhaust port 122 by the branch wall 13 and the ribs 14 and 15 illustrated in FIG. 1. The ribs 14 and 15 are erected from the branch wall 13 toward the heat sink 2. Further, a plurality of the ribs 14 and 15 are provided along the X axis (side by side in the left-right direction) at fixed intervals. Details will be described later (see FIGS. 4 and 5).

Structures of Branch Wall and Rib

Figure 4:
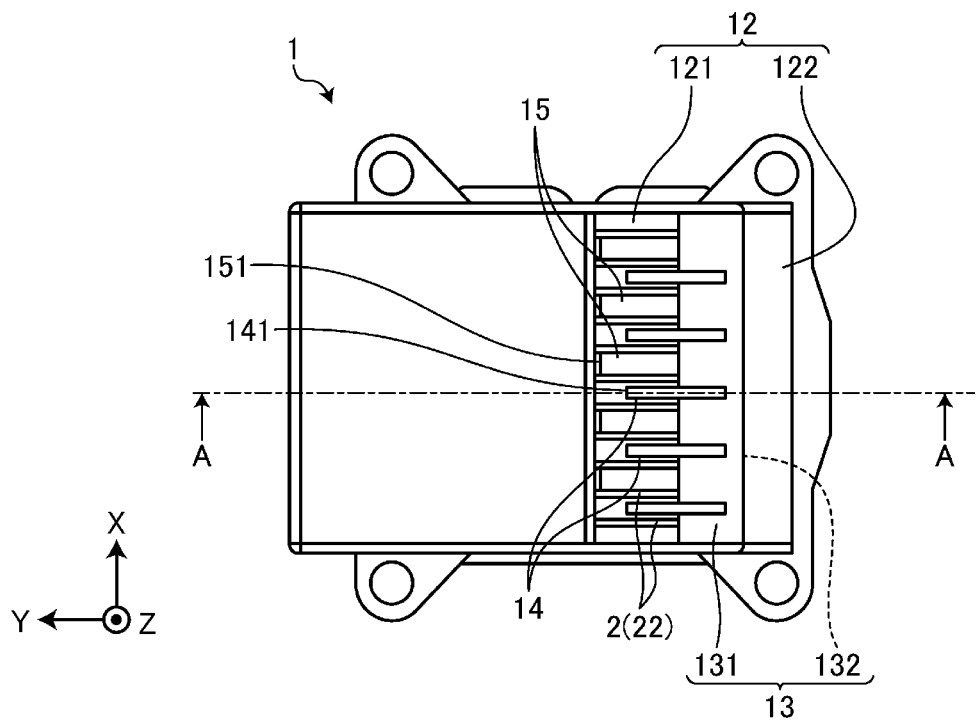
FIG. 4 is a plan view illustrating an example of a shape of the fan duct.
Figure 5:
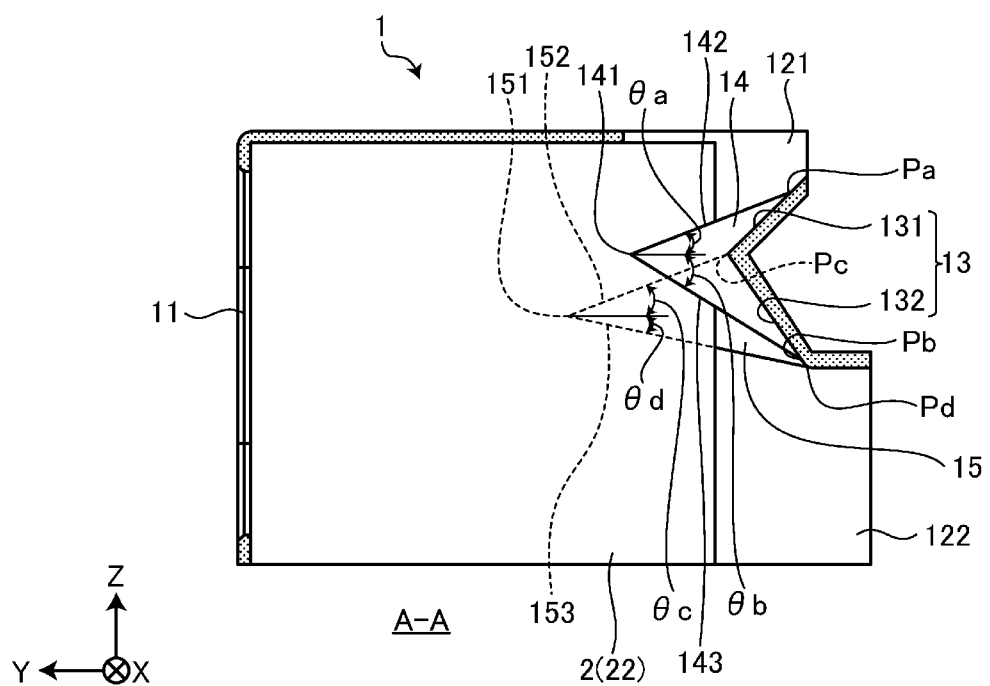
FIG. 5 is a longitudinal side view illustrating the example of the shape of the fan duct.

Structures of the branch wall 13 and the ribs 14 and 15 will be described with reference to FIGS. 4 and 5. FIG. 4 is a plan view illustrating an example of a shape of the fan duct. FIG. 5 is a longitudinal sectional view illustrating the example of the shape of the fan duct.

The branch wall 13 is disposed at an inner side of an edge of the exhaust port 12, and has a substantially V-shaped cross section in a side view as illustrated in FIG. 5, and a bent portion thereof protrudes toward the heat sink 2. The flow of air passing between the fins 22 of the heat sink 2 is divided into two by the branch wall 13.

The branch wall 13 is disposed downstream in the flow of air across the plurality of fins 22 of the heat sink 2 in a manner of being orthogonal to a longitudinal direction of the fins 22. The branch wall 13 includes an upper wall portion 131 and a lower wall portion 132. The upper wall portion 131 and the lower wall portion 132 are connected at sides along the X axis upstream in the air blowing direction of the suction fan 3. The upper wall portion 131 and the lower wall portion 132 are inclined with respect to the air blowing direction of the suction fan 3 such that a distance therebetween increases toward the downstream side in the air blowing direction of the suction fan 3. The upper wall portion 131 guides the flow of air, which passes between the fins 22 of the heat sink 2, in an obliquely upward direction. The lower wall portion 132 guides the flow of air, which passes between the fins 22 of the heat sink 2, in an obliquely downward direction. In this way, the branch wall 13 guides the exhaust so as to avoid a partial range downstream of the branch wall 13 (a range where the input and output boards 106 and 107 are disposed (see FIG. 6)) and branches the exhaust.

The branch wall 13 divides the exhaust port 12 into the upper exhaust port 121 and the lower exhaust port 122. The upper exhaust port 121 discharges the exhaust, which flows along the upper wall portion 131, from the vent hole 164 (see FIG. 3) to the outside of the housing 110. The lower exhaust port 122 discharges the exhaust, which flows along the lower wall portion 132, from the vent holes 165, 166, and 167 (see FIG. 3) to the outside of the housing 110. As illustrated in FIG. 5, the branch wall 13 has a substantially V-shaped cross section in a side view, and the bent portion thereof protrudes toward the heat sink 2. The flow of air passing between the fins 22 of the heat sink 2 is divided into two by the branch wall 13.

The upper wall portion 131 and the lower wall portion 132 of the branch wall 13 are provided with a plurality of ribs 14 that are directed toward the fins 22 of the heat sink 2 and that are parallel to the fins 22. Each rib 14 is formed of, for example, a resin material or a metal material, and is a plate-like member including a pointed apex portion 141 at a tip end thereof. A base of the rib 14 is connected to the upper wall portion 131 at a rib upper rear end Pa and connected to the lower wall portion 132 at a rib lower rear end Pb. The rib 14 is inserted between the fins 22. A region of the rib 14 that is inserted between the fins 22 is not in contact with the fin 22.

The lower wall portion 132 of the branch wall 13 is provided with a plurality of ribs 15 that face the fins 22 of the heat sink 2 and that are parallel to the fins 22. The ribs 15 are each formed of, for example, a resin material or a metal material, and is a plate-like member including a pointed apex portion 151 at a tip end thereof. A base of the rib 15 is connected to the lower wall portion 132 at a rib upper rear end Pc and a rib lower rear end Pd. The rib 15 is inserted between the fins 22. Both surfaces of a region of the rib 15 that is inserted between the fins 22 are in contact with the fin 22.

As described above, the rib 14 and the rib 15 have different lengths and orientations, and the rib 14 and the rib 15 are alternately formed along the X axis. That is, the fan duct 1 includes the rib 14 and the rib 15 that have two different types of forms.

Each of an upper edge portion 142 and a lower edge portion 143 of the rib 14 is formed in a straight line in a side view of the rib 14. A deflection angle θa between the upper edge portion 142 of the rib 14 and an exhaust direction of the air passing between the fins 22 of the heat sink 2 (−Y-axis negative direction) is formed to be 30° or less. Further, a deflection angle θb between the lower edge portion 143 of the rib 14 and the exhaust direction of the air passing between the fins 22 of the heat sink 2 (−Y-axis negative direction) is also formed to be 30° or less. The upper edge portion 142 and the lower edge portion 143 may be formed in a curved line. Further, the upper edge portion 142 and the lower edge portion 143 may be formed in a combination of a straight line and a curved line. Details will be described later (see FIG. 7).

Each of an upper edge portion 152 and a lower edge portion 153 of the rib 15 is formed in a straight line in a side view of the rib 15. A deflection angle θc between the upper edge portion 152 of the rib 15 and the exhaust direction of the air passing between the fins 22 of the heat sink 2 (−Y-axis negative direction) is formed to be 30° or less. Further, a deflection angle θd between the lower edge portion 153 of the rib 15 and the exhaust direction of the air passing between the fins 22 of the heat sink 2 (−Y-axis negative direction) is also formed to be 30° or less. The upper edge portion 152 and the lower edge portion 153 may be formed in a curved line. Details will be described later (see FIG. 7).

The bases of the ribs 14 and 15 are smoothly connected to the branch wall 13. Details will be described later (see FIG. 7).

In the example of FIGS. 4 and 5, the rib 14 is formed over the upper wall portion 131 and the lower wall portion 132, and the rib 15 is formed in a region of the lower wall portion 132, and the present disclosure is not limited thereto. That is, the rib 14 and the rib 15 may be formed over both the upper wall portion 131 and the lower wall portion 132, or in a region of either one.

Here, at least the rib 15 in contact with the fin 22 of the heat sink 2 may be formed of a material having high thermal conductivity (for example, a metal such as aluminum or copper, or a resin material such as a high-thermal-conductivity polycarbonate resin). Accordingly, an apparent surface area of the fins 22 of the heat sink 2 is increased, thereby further improving the cooling performance.

Positional Relationship Between Exhaust Port of Fan Duct and Mounted Components

Figure 6:
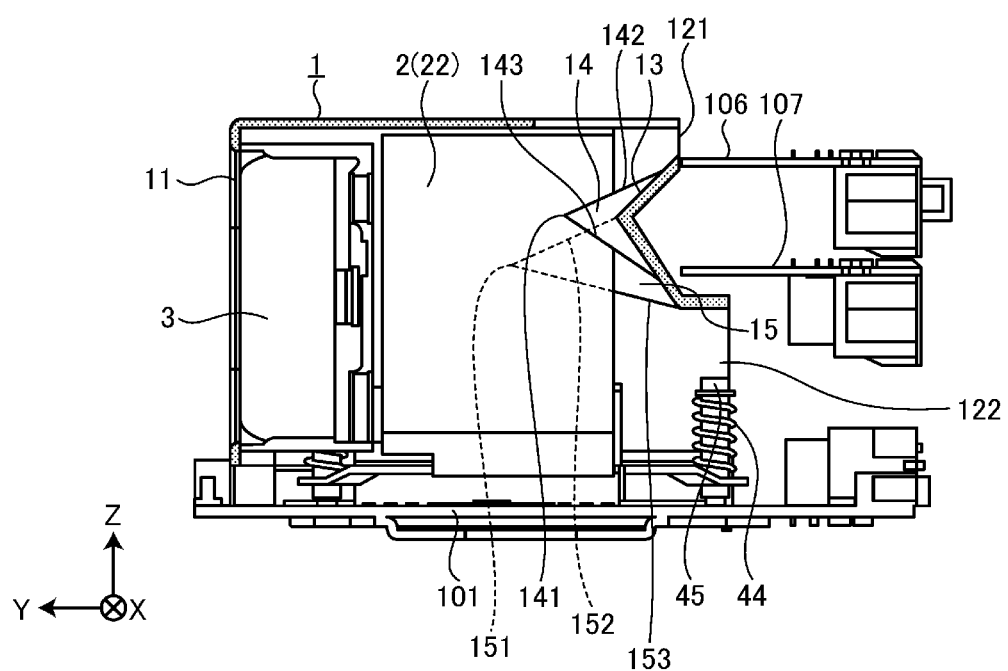
FIG. 6 is a longitudinal side view for illustrating a positional relationship between the fan duct and components near an exhaust port.

A positional relationship between the fan duct 1 of the embodiment and components mounted near the exhaust port will be described with reference to FIG. 6. FIG. 6 is a longitudinal sectional side view illustrating a positional relationship between the fan duct and components near the exhaust port.

As illustrated in FIG. 6, the input and output boards 106 and 107 mounted near the exhaust port are disposed at a position not exposed to the exhaust from the upper exhaust port 121 and the exhaust from the lower exhaust port 122. Accordingly, the fan duct 1 enables components to be arranged downstream of the fan duct 1 without hindering the cooling performance for the CPU 102 in the electronic equipment 100 (see FIG. 2).

In such a configuration, when the electronic equipment 100 is energized, the CPU 102, the memory 103, the SSD 104, and the like generate heat, and temperatures thereof rise. When the suction fan 3 operates to blow air, the air flows inside the fan duct 1, and thus the CPU 102 for which the heat sink 2 is disposed is cooled. Further, at this time, among the exhaust from the upper exhaust port 121 and the lower exhaust port 122, air that is not discharged to the outside of the housing 110 (see FIG. 2) moves, for example, toward the intake port 11 inside the housing 110. Accordingly, since a flow of air is also generated outside the fan duct 1, the memory 103, the SSD 104, and the like for which the heat sink 2 is not disposed are also cooled by the flow of air.

Shape of Edge of Rib

Figure 7:
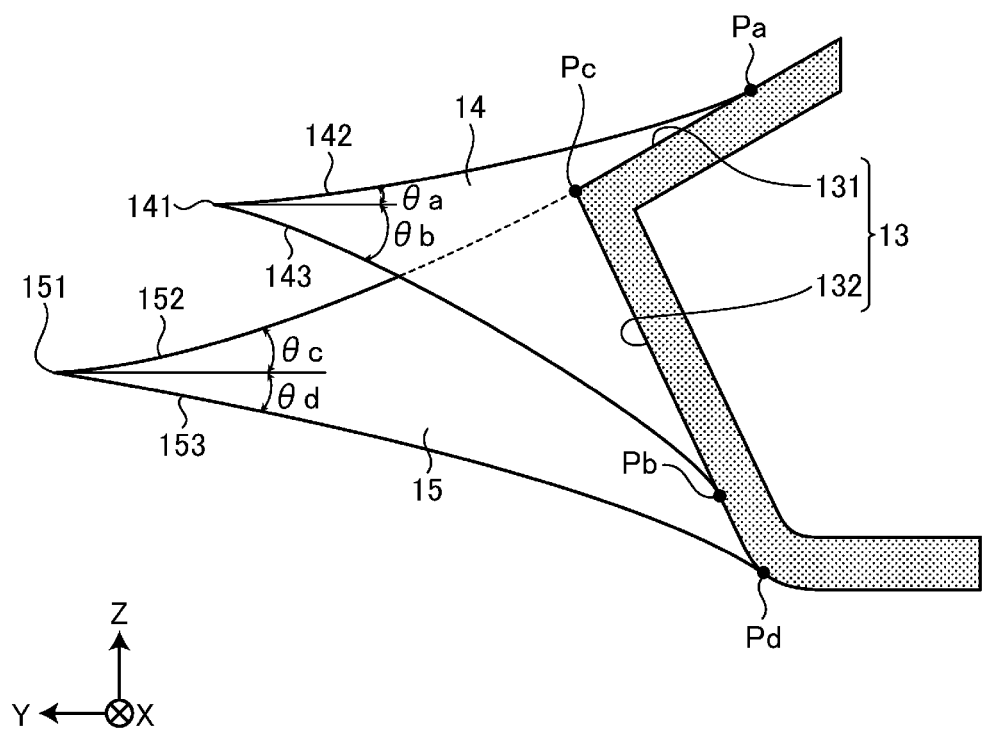
FIG. 7 is a diagram illustrating an example of a shape of a rib.

Specific shapes of the upper edge portions 142 and 152 and the lower edge portions 143 and 153 of the ribs 14 and 15 will be described with reference to FIG. 7. FIG. 7 is a diagram illustrating an example of the shape of the rib.

In the rib 14 illustrated in FIG. 7, the upper edge portion 142 and the lower edge portion 143 both have a curved shape. The upper edge portion 142 is connected to the upper wall portion 131 at the rib upper rear end Pa. The lower edge portion 143 is connected to the lower wall portion 132 at the rib lower rear end Pb.

At this time, a tangent of the upper edge portion 142 at the rib upper rear end Pa coincides with a tangent of the upper wall portion 131 at the rib upper rear end Pa. That is, the upper edge portion 142 and the upper wall portion 131 are smoothly connected at the rib upper rear end Pa. Further, a tangent of the lower edge portion 143 at the rib lower rear end Pb coincides with a tangent of the lower wall portion 132 at the rib lower rear end Pb. That is, the lower edge portion 143 and the lower wall portion 132 are smoothly connected at the rib lower rear end Pb.

Further, in the rib 15 illustrated in FIG. 7, the upper edge portion 152 and the lower edge portion 153 both have a curved shape. The upper edge portion 152 is connected to the upper wall portion 131 at the rib upper rear end Pc. The lower edge portion 153 is connected to the lower wall portion 132 at the rib lower rear end Pd.

At this time, a tangent of the upper edge portion 152 at the rib upper rear end Pc coincides with a tangent of the upper wall portion 131 at the rib upper rear end Pc. That is, the upper edge portion 152 and the upper wall portion 131 are smoothly connected at the rib upper rear end Pc. A tangent of the lower edge portion 153 at the rib lower rear end Pd coincides with a tangent of the lower wall portion 132 at the rib lower rear end Pd. That is, the lower edge portion 153 and the lower wall portion 132 are smoothly connected at the rib lower rear end Pd.

Although a specific shape of a curve forming the upper edge portion 142 and the lower edge portion 143 of the rib 14 is not limited, the deflection angle θa of the upper edge portion 142 of the rib 14 gradually increases from the apex portion 141 to the rib upper rear end Pa, and is formed to be 30° or less from the apex portion 141 to the rib upper rear end Pa. The deflection angle θb of the lower edge portion 143 of the rib 14 gradually increases from the apex portion 141 to the rib lower rear end Pb, and is formed to be 30° or less from the apex portion 141 to the rib lower rear end Pb. The upper edge portion 142 and the lower edge portion 143 of the rib 14 may be formed in a combination of a curved line and a straight line.

Further, although a specific shape of a curve forming the upper edge portion 152 and the lower edge portion 153 of the rib 15 is not limited, the deflection angle θc of the upper edge portion 152 of the rib 15 gradually increases from the apex portion 151 to the rib upper rear end Pc, and is formed to be 30° or less from the apex portion 151 to the rib upper rear end Pc. The deflection angle θd of the lower edge portion 153 of the rib 15 gradually increases from the apex portion 151 to the rib lower rear end Pd, and is formed to be 30° or less from the apex portion 151 to the rib lower rear end Pd. The upper edge portion 152 and the lower edge portion 153 of the rib 15 may be formed in a combination of a curved line and a straight line.

Operations and Effects of First Embodiment

As described above, the fan duct 1 (cooling device) according to the first embodiment includes: the intake port 11 provided with the suction fan 3 (fan) and configured to introduce air; the heat sink 2 configured to dissipate heat generated from the electronic equipment by allowing air introduced from the intake port 11 to pass between the plurality of fins 22; the branch wall 13 disposed downstream in the flow of air across the plurality of fins 22 of the heat sink 2 in a manner of being orthogonal to the longitudinal direction of the fins 22, and configured to branch the flow of air passing between the fins 22 into two directions; the plurality of ribs 14 and 15 that have two different types of forms alternately arranged, the ribs 14 and 15 each being a plate-like member disposed from the branch wall 13 toward the fins 22 in a manner of being parallel to the fins 22 and including the apex portions 141 and 151 at the tip end thereof, the ribs 14 and 15 being configured to branch, at the tip end, the flow of air passing between the fins 22 into two directions, the tip end of the rib being inserted between adjacent ones among the fins 22, the base of the ribs being connected to the branch wall 13; and the exhaust port 12 configured to exhaust the air branched by the ribs 14 and 15 and the branch wall 13. Among the ribs 14 and 15 alternately inserted between the adjacent fins 22, at least the ribs 14 or the ribs 15 of one form is in contact with the fin 22. Accordingly, even when there is an obstacle leeward of the heat sink 2, good cooling performance can be obtained. In addition, a size of the heat sink 2 can be increased as much as possible in a limited space by inserting the rib 14 between the fins 22 of the heat sink 2, and thus both the miniaturization of the electronic equipment 100 and the improvement of the cooling performance can be achieved. Further, since at least one of the rib 14 and the rib 15 inserted between the fins 22 of the heat sink 2 comes into contact with the fin 22, the apparent surface area of the fins 22 of the heat sink 2 can be increased. Accordingly, the cooling performance can be further improved. Further, even when there is a shift between a pitch of the fins 22 of the heat sink 2 and a pitch of the ribs 14 and 15, the shift of the pitch can be absorbed by the elasticity of the ribs 14 and 15, and the fins 22 of the heat sink 2 can be reliably brought into contact with the ribs 14 or the ribs 15.

In the fan duct 1 (cooling device) according to the embodiment, among the ribs 14 and 15, at least the ribs in contact with the fin 22 are formed of a material having high thermal conductivity. Accordingly, the apparent surface area of the fins 22 of the heat sink 2 can be increased. Accordingly, the cooling performance can be further improved.

In the fan duct 1 (cooling device) according to the embodiment, the tangents of the ribs 14 and 15 and the tangents of the branch wall 13, at the connection points between the bases of the ribs 14 and 15 and the branch wall 13 (the rib upper rear end Pa and the rib lower rear end Pb of the rib 14 and the rib upper rear end Pc and the rib lower rear end Pd of the rib 15), coincide with each other correspondingly in the side view of the ribs 14 and 15. Accordingly, the air branched at the apex portion 141 of the rib 14 can smoothly flow from the upper edge portion 142 to the upper wall portion 131. The air branched at the apex portion 141 of the rib 14 can smoothly flow from the lower edge portion 143 to the lower wall portion 132. The air branched at the apex portion 151 of the rib 15 can smoothly flow from the upper edge portion 152 to the upper wall portion 131. The air branched at the apex portion 151 of the rib 15 can smoothly flow from the lower edge portion 153 to the lower wall portion 132. Accordingly, smooth exhaust can be performed.

In the fan duct 1 (cooling device) according to the embodiment, an interval between the upper edge portion 142 and the lower edge portion 143 of the rib 14 increases toward the base of the rib 14, and the upper edge portion 142 and the lower edge portion 143 are both formed in a straight line, a curved line, or a combination thereof in a side view of the rib 14. Further, an interval between the upper edge portion 152 and the lower edge portion 153 of the rib 15 increases toward the base of the rib 15, and both the upper edge portion 152 and the lower edge portion 153 are formed in a straight line, a curved line, or a combination thereof in a side view of the rib 15. Accordingly, the air branched at the apex portion 141 of the rib 14 and the air branched at the apex portion 151 of the rib 15 can smoothly flow downstream.

Second Embodiment

A second embodiment in which a cooling device of the present disclosure is applied as a fan duct 10 will be described with reference to the drawings.

Another Form of Rib

Figure 8:
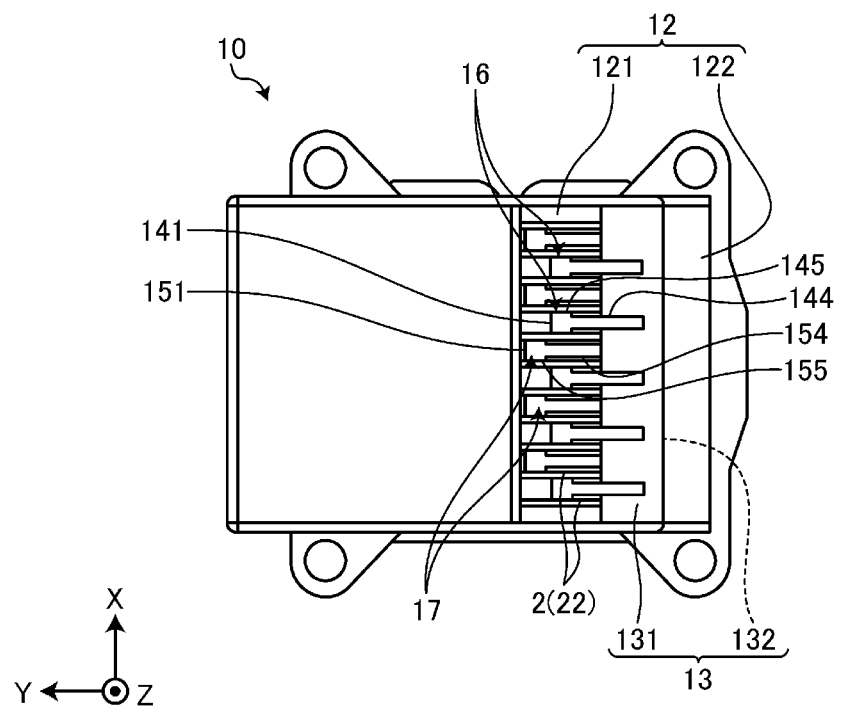
FIG. 8 is a plan view illustrating another example of the shape of the fan duct.

Forms of ribs 16 and 17 provided in the fan duct 10 serving as an example of the cooling device of the present disclosure will be described with reference to FIG. 8. FIG. 8 is a plan view illustrating another example of the shape of the fan duct.

Similarly to the first embodiment described above, the fan duct 10 includes the branch wall 13 that branches a flow of air passing between the fins 22 of the heat sink 2 into two directions. Similarly to the first embodiment, the branch wall 13 includes the upper wall portion 131 and the lower wall portion 132.

The upper wall portion 131 and the lower wall portion 132 of the branch wall 13 are provided with a plurality of ribs 16 that are directed toward the fins 22 of the heat sink 2 and that are parallel to the fins 22. The lower wall portion 132 of the branch wall 13 is provided with a plurality of ribs 17 that are directed toward the fins 22 of the heat sink 2 and that are parallel to the fins 22.

Similarly to the ribs 14 and 15 described in the first embodiment, the ribs 16 and the ribs 17 provided in the fan duct 10 have different forms in a side view. A base portion 144 of the ribs 16 and a base portion 154 of the ribs 17 have substantially the same thickness. An interval between the base portion 144 of the ribs 16 and the base portion 154 of the ribs 17 is smaller than an interval between the fins 22 of the heat sink 2.

Further, the ribs 16 are each formed such that a thickness of a tip end portion 145 thereof including the apex portion 141 is larger than the thickness of the base portion 144. Both surfaces of the tip end portion 145 are in contact with the fin 22. The ribs 17 are each formed such that a thickness of a tip end portion 155 thereof including the apex portion 151 is larger than the thickness of the base portion 154. Both surfaces of the tip end portion 155 are in contact with the fin 22. That is, the tip end portion 145 of the rib 16 and the tip end portion 155 of the rib 17 alternately contact the fin 22 at different positions.

With such a contact structure, even when there is a shift between a pitch of the fins 22 of the heat sink 2 and a pitch of the ribs 16 and 17, the shift of the pitch is absorbed by elasticity of the ribs 16 and 17, and thus the fins 22 of the heat sink 2 and the ribs 16 and 17 are reliably brought into contact with each other.

Operations and Effects of Second Embodiment

As described above, in the fan duct 10 (cooling device) according to the second embodiment, all of the ribs 16 and 17 having two types of forms, which are alternately inserted between the adjacent fins 22, are alternately in contact with the fins 22 at different positions. Accordingly, a dimensional error between the pitch of the fins 22 of the heat sink 2 and the pitch of the ribs 16 and 17 can be absorbed, and the fins 22 of the heat sink 2 and the ribs 16 and 17 can be more reliably brought into contact with each other.

While certain embodiments have been described, these embodiments have been presented by way of example only, and are not intended to limit the scope of the embodiments. The novel embodiments can be implemented in various other forms, and various omissions, replacements, and modifications can be made without departing from the gist of the embodiments. The embodiments and modifications thereof are included in the scope and the gist of the embodiments, and are included in the disclosure described in the claims and the scope of equivalents of the disclosure.

What is claimed is:

1. A cooling device for an electronic equipment, comprising:
    an intake port comprising a fan and configured to introduce air;
    a heat sink configured to dissipate heat generated from the electronic equipment by allowing air introduced from the intake port to pass between a plurality of fins;
    a branch wall disposed downstream in a flow of the air across the plurality of fins of the heat sink in a manner of being orthogonal to a longitudinal direction of the fins, and configured to branch a flow of air passing between the plurality of fins into two different directions;
    a plurality of ribs that have two different types of forms alternately arranged, each rib being a plate-like member disposed from the branch wall toward the fins in a parallel manner to the fins and comprising an apex portion at a tip end thereof, the plurality of ribs being configured to branch, at the tip end, the flow of air passing between the fins into two different directions, the tip end of the rib being inserted between adjacent ones among the fins, a base of each rib being connected to the branch wall; and
    an exhaust port configured to exhaust the air branched by the rib and the branch wall, wherein
    among the ribs alternately inserted between the adjacent fins, at least ribs of one form are in contact with the fins.

2. The cooling device according to claim 1, wherein all of the ribs having one type of two types of forms, which are alternately inserted between the adjacent fins, are alternately in contact with the fin at different positions.

3. The cooling device according to claim 1, wherein among the plurality of ribs, at least the ribs in contact with the fins are formed of a material having high thermal conductivity.

4. The cooling device according to claim 3, wherein a tangent of each rib and a tangent of the branch wall, at a connection point between the base of each of the plurality of the ribs and the branch wall, coincide with each other in a side view of the rib.

5. The cooling device according to claim 4, wherein an interval between an upper edge portion and a lower edge portion of the rib increases toward the base of the rib, and both the upper edge portion and the lower edge portion are formed in a straight line, a curved line, or a combination thereof in a side view of the rib.

6. The cooling device according to claim 1, wherein the branch wall is disposed at an inner side of an edge of the exhaust port and has a substantially V-shaped cross section.

7. The cooling device according to claim 1, wherein the plurality of fins are adjacent to each other at a predetermined interval.

8. The cooling device according to claim 1, wherein the electronic equipment comprises at least one of a central processing unit, a motherboard, a memory, a solid state drive, a riser card, and an I/O board.

9. The cooling device according to claim 1, wherein the plurality of ribs are adjacent to each other at a predetermined interval.

10. The cooling device according to claim 1, wherein the heat sink is fixed onto two frames layered at predetermined intervals, by helical springs and screws.

11. A personal computer, comprising:
    central processing unit; and
    a cooling device, comprising:
        an intake port comprising a fan and configured to introduce air;
        a heat sink configured to dissipate heat generated from the central processing unit by allowing air introduced from the intake port to pass between a plurality of fins;
        a branch wall disposed downstream in a flow of the air across the plurality of fins of the heat sink in a manner of being orthogonal to a longitudinal direction of the fins, and configured to branch a flow of air passing between the plurality of fins into two different directions;

a plurality of ribs that have two different types of forms alternately arranged, each rib being a plate-like member disposed from the branch wall toward the fins in a parallel manner to the fins and comprising an apex portion at a tip end thereof, the plurality of ribs being configured to branch, at the tip end, the flow of air passing between the fins into two different directions, the tip end of the rib being inserted between adjacent ones among the fins, a base of each rib being connected to the branch wall; and an exhaust port configured to exhaust the air branched by the rib and the branch wall, wherein among the ribs alternately inserted between the adjacent fins, at least ribs of one form are in contact with the fins.

12. The personal computer according to claim 11, wherein all of the ribs having one type of two types of forms, which are alternately inserted between the adjacent fins, are alternately in contact with the fin at different positions.

13. The personal computer according to claim 11, wherein among the plurality of ribs, at least the ribs in contact with the fins are formed of a material having high thermal conductivity.

14. The personal computer according to claim 13, wherein a tangent of each rib and a tangent of the branch wall, at a connection point between the base of each of the plurality of the ribs and the branch wall, coincide with each other in a side view of the rib.

15. The personal computer according to claim 14, wherein an interval between an upper edge portion and a lower edge portion of the rib increases toward the base of the rib, and both the upper edge portion and the lower edge portion are formed in a straight line, a curved line, or a combination thereof in a side view of the rib.

16. The personal computer according to claim 11, wherein the branch wall is disposed at an inner side of an edge of the exhaust port and has a substantially V-shaped cross section.

17. The personal computer according to claim 11, wherein the plurality of fins are adjacent to each other at a predetermined interval.

18. The personal computer according to claim 11, further comprises at least one of a motherboard, a memory, a solid state drive, a riser card, and an I/O board.

19. The personal computer according to claim 11, wherein the plurality of ribs are adjacent to each other at a predetermined interval.

20. The personal computer according to claim 11, wherein the heat sink is fixed onto two frames layered at predetermined intervals, by helical springs and screws.

* * * * *